(12) United States Patent
Lejeune (10) Patent No.: US 6,269,326 B1
(45) Date of Patent: *Jul. 31, 2001

(54) METHOD FOR TESTING ELECTRONIC COMPONENTS

(75) Inventor: Philippe Lejeune, Sours (FR)

(73) Assignee: Softlink, Dourdan (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/194,029

(22) PCT Filed: May 23, 1997

(86) PCT No.: PCT/FR97/00908

§ 371 Date: Nov. 16, 1998

§ 102(e) Date: Nov. 16, 1998

(87) PCT Pub. No.: WO97/45748

PCT Pub. Date: Dec. 4, 1997

(30) Foreign Application Priority Data

May 29, 1996 (FR) .................................................. 96 06611

(51) Int. Cl.[7] .................................................. G06F 17/30
(52) U.S. Cl. .................................. 703/2; 716/6; 700/51; 700/121
(58) Field of Search .................................. 703/2, 22, 14; 716/4, 5, 6; 700/51, 48, 50, 115, 121; 702/117, 121; 378/22; 324/158.1

(56) References Cited

U.S. PATENT DOCUMENTS

| | | | |
|---|---|---|---|
| 4,926,452 | * 5/1990 | Baker et al. | 378/22 |
| 4,977,531 | 12/1990 | Ogata et al. | 702/119 |
| 5,036,479 | * 7/1991 | Prednis et al. | 702/121 |
| 5,589,765 | * 12/1996 | Ohmart et al. | 324/158.1 |
| 5,673,194 | * 9/1997 | Cipelletti et al. | 700/115 |
| 5,838,568 | * 11/1998 | Dickenson et al. | 700/121 |

FOREIGN PATENT DOCUMENTS

| | | |
|---|---|---|
| 35 30 308 | 2/1987 | (DE) . |
| 0 171 322 | 2/1986 | (EP) . |
| 0 646 802 | 4/1995 | (EP) . |

OTHER PUBLICATIONS

H.G. Parks, Yield Modeling from SRAM Failure Analysis, Proceedings of the 1990 Int'l Conference on Microelectronic Test Structures, ICMTS 1990, vol. 3, Mar. 1990, pp. 169–174.*

G. Scher et al., In–Line Statistical Process Control and Feedback for VLSI Integrated Circuit Manufacturing, IEEE Transactions on Components, Hybrids, and Manufacturing Technology, vol. 13, No. 3, Sep. 1990, pp. 484–489.*

M.S. Srivastava et al., Estimation and Testing in an Imperfect–Inspection Model, IEEE Transactions on Reliability, vol. 42, No. 2, Jun. 1993, pp. 280–286.*

K. Feldmann et al., Yield Improvement in SMT Production by Integrated Process Monitoring and Testing, 15th IEEE/CHMT International, Electronic Manufacturing Technology Symposium, 1993, pp. 229–234.*

(List continued on next page.)

Primary Examiner—Kevin J. Teska
Assistant Examiner—Russell W. Frejd
(74) Attorney, Agent, or Firm—Nilles & Nilles SC (57) ABSTRACT

A device (1) has a processor (13) capable of controlling test equipment (2) to carry out repeatedly at least some of its steps, each time reducing the duration of at least one of the steps until satisfying a final criterion taking into account the distribution of the electric variables measured by the equipment for each reduced duration value, and to set a new duration value at most equal to its initial value, for which the measured electric variable distribution satisfies one selected dispersion condition. The device has a function generator (14) capable of providing a function applicable to at least one of the terms of a comparison executed during one of the steps, so that the function operates on a measurement executed after the new duration.

17 Claims, 6 Drawing Sheets

OTHER PUBLICATIONS

J.-P. Clech et al., Surface Mount Assembly Failure Statistics and Failure Free Time, Proceedings of the 44th Electronic Components and Technology Conference, 1994, pp. 487–497.*

M.R. Cooper, Statistical Methods for Stress Screen Development, Proceedings of the 46th Electronic Components and Technology Conference, 1996, pp. 925–930.*

J. Rajgopal et al., A System–Based Component Test Plan for a Series System, with Type–II Censoring, IEEE Transactions on Reliability, vol. 45, No. 3, Sep. 1996, pp. 375–378.*

S. Patro et al., Neural Networks and Evolutionary Computation for Real–Time Quality Control of Complex Processes, 1997 Proceedings Annual Reliability and Maintainability Symposium, pp. 327–332.*

H. A. Stieber, Statistical Quality Control: How to Detect Unreliable Software Components, The 8th Int'l Symposium on Software Reliability Engineering, Proceedings, 1997, pp. 8–12.*

* cited by examiner

FIG_3a

FIG_3b

FIG_3c

FIG_3d

FIG_3e

METHOD FOR TESTING ELECTRONIC COMPONENTS

BACKGROUND OF THE INVENTION

1. Field of the Invention

The invention relates to the testing of electronic components.

When they come off the production line, semiconductor electronic components are tested by a testing machine when they are still joined together on a wafer and/or in the state of unit components, packaged or not packaged, possibly in the form of strips.

The testing machine comprises electrodes laid out respectively so as to come into contact with the conductive zones (or regions) of the components. Signals are applied to these electrodes and picked up by them by means of an interface configured by testing means of the machine.

The testing machine comprises a set of electronic modules and software programs whose general function is to compare each measured value with a reference value or interval (or field of validity), in order to make a general decision on whether the component is sound or defective. Finer decisions may be taken, for example when similar components are manufactured together but guaranteed with different tolerance brackets.

More specifically, the software programs may be broken down into a library of tools, a definition of constants, variables and data tables (multiplets) especially for the reference intervals, a sequence of elementary tests for the acquisition of measurements and their comparison with the reference intervals and a final decision mechanism.

The elementary tests of the sequence are stored in a memory of the testing means and subdivided into steps managed by a sequencer. Thus, each test generally comprises the following steps:

a) configuring the interface with a view to the performance of a chosen elementary test (this step consists of the selective designation of the electrodes to which the chosen electrical signals must be applied), b) after the application of the electrical signal (or signals) chosen for the elementary test, waiting for a first nominal fixed stabilizing period (or at least the longest of the first stabilizing periods) corresponding to the test, c) selectively picking up, on the designated electrodes, the electrical measurable quantity or quantities designated by the elementary test and representing the responses of the component to the chosen electrical signals, d) if necessary, waiting for a second fixed measurement period (or at least the longest of the second measurement periods) corresponding to the elementary test in order that the measurement of the designated electrical quantity may be stabilized in the measurement machine, e) reading the measurement or measurements of the electrical quantity or quantities designated by the elementary test, and f) comparing the measured electrical quantity with the domain of validity corresponding to the elementary test.

2. Description of the Related Art

Since the number of test operations to be performed is generally very great, the overall wait that results from the adding together of the first and possibly the second waiting phases (or periods) is great (each waiting phase may last at least some milliseconds). This is a major problem in an industry that is constantly seeking higher productivity.

The wait is further aggravated by the fact that the duration of each elementary waiting phase of a testing operation is fixed rather on the higher side, for quality is still more important than productivity. This precaution makes it possible to cover the entire range of variations between the batches.

OBJECTS AND SUMMARY OF THE INVENTION

It is therefore an aim of the invention to enable the reduction of the durations of the waiting phases of electronic component testing machines of the type described in the introduction.

To this end, the invention proposes a method for the testing of electronic components in which:

electrodes of these components are subjected, at an initial date, to electrical potentials, a measurement is made, at a measuring date, of the values of the potentials set up at the terminals of these components, and these measured values are compared with typical values in order to accept or reject the components as a function of this comparison, characterized in that, for the comparison:

a nominal statistical image is determined at a nominal date corresponding to a nominal waiting duration after this initial date, for an acceptable batch of components and for a given test, an intermediate statistical image is determined for this acceptable batch at least one intermediate date prior to or after the end of the nominal waiting duration, the earliest possible intermediate date during the measurement duration is chosen by the comparison, using a criterion, of the nominal and intermediate statistical images of the measured values, and the earliest possible intermediate date is chosen as the date of measurement of the test.

In the invention, the waiting duration is the nominal duration at the end of which the potential is normally stabilized at the terminals of the components. This duration is indicated in practice in the technical specifications of the component. An acceptable component, also known as a component to be accepted, is a component which is furthermore known to be acceptable. A component of this kind may be identified individually. More generally, a component to be accepted is virtual: its characteristics may be the result of statistical measurements performed on a set of components deemed to be individually acceptable. Or again, the characteristics of the component to be accepted are the result of statistical measurements performed on a set of components after the elimination of aberrant measurements.

In the invention, it has thus been realized that the best method for looking for the earliest date consists in carrying out a statistical study on samples for a given test, at a given measurement date, and in searching for a compatible statistical distribution with respect to another measurement date.

Thus, in a preferred embodiment, for a given population, namely for given samples for a given test, at a given measurement date, a computation is made firstly of an average of the measurements, referenced M and, secondly, of a standard deviation of the measurements referenced S (for sigma). It can already be seen that it would have been possible to choose other statistical elements such as the median, the mean of the 1st, 2nd, 3rd or 4th quartile, the differences between these mean values or the like. For the time being, it will be noted that these useful elements will be the mean and the standard deviation.

Then, for the same samples and for the test, but for another earlier (or later) measurement date known as an intermediate date, measurements are made and the same elements, namely a mean M' and a standard deviation S', are computed.

Furthermore, a criterion of appreciation referenced CP is defined. In one example, this criterion of appreciation CP is equal to the ratio between a difference of limits and S. In this example, the difference of limits is given by manufacturers tolerance To and CP=To/S. The difference of limits for a measurement in which a result of 5 volts is expected is equal for example to ±0.5 volts. The difference of limits is therefore To=1 volt in this case. If, instead of measuring values achieved at the test points (for example 5 volts), a difference is measured between a value achieved and a value to be achieved, the result can be expressed with greater precision. Above all, in this case, it becomes similar for all the different tests so that one and the same selection method may be used.

A computation is made in the invention for another measurement date, known as an intermediate date, of the result of the same criterion, for example CP'=To/S'. The manufacturer's tolerance remains the same. The standard deviation has changed. According to the invention, it has been planned that, for a given structure of samples, the standard deviation S' and hence the criterion CP' depend on the date on which the measurement is made. It has been discovered in the invention that if we go back in time, the standard deviation S' increases. Everything happens as if the time remaining to be travelled after the intermediate date then appears as a phenomenon of the narrowing of the statistical characteristics. Everything happens as if the time remaining to be travelled has a smoothing effect on the measurements. For example, an erratic output signal at an early date T' becomes an acceptable signal at the end of a duration T that is sufficiently long and in any case longer than T'.

On this basis, in the invention the idea has arisen that, in order to define the earliest date T', a choice should be made of the date T' for which the criterion CP' (or the standard deviation S') is in a given proportion of the basic criterion CP (or respectively of the basic standard deviation S). In one example, the given proportion is 1%, 2% or even 5%.

In other words, a batch of components is tested with predefined waiting phases. Then, the same test is made on the same batch of components, in reducing the first period (the pre-capture stabilization phase). Depending on the result, either the test is continued on the same batch of components, in again reducing the waiting phase, or it is assumed that the modified period or periods are sufficiently small so that henceforth they can be used as new periods for the tests or the components to be tested.

In one improvement, in a preparatory phase, an acquisition is made of what shall hereinafter be called a gradual intermediate value, a value for example of the measurement of a potential at a terminal. This intermediate value is called progressive because the potential at this terminal can be modified from a basic value, during the application of the electrical signal (generally the basic value is 0 volts), up to a stabilized value (generally Vcc or even Vcc/2). However, the measurement may equally well be a voltage or current measurement (in both cases DC or AC voltage or current), a frequency, a measured temperature and the result of a computation or any other value. The progress of the value of this potential is repetitive. Its chronology is always the same. A progressive value is then acquired at the intermediate date, before the end of the nominal waiting duration. This gradual value may be equal to the stabilized value itself: in this case, the nominal waiting duration planned is quite simply fixed to excess. This gradual value however may be different (in general lower) than the stabilized value. Owing to the repetitive nature of the phenomenon, it is certain that, for a component, the chronology will be the same.

In this case, in the invention, the pair formed by the nominal duration and the standard value is replaced by the pair formed by the intermediate date and the gradual or intermediate standard value. The test then consists, on a component to be tested, in making an early measurement of a potential value at the intermediate date and in comparing this measured early value with the intermediate progressive standard value chosen on a component to be accepted.

While many voltages or other electrical quantities to be tested are increasing values, with a passage from 0 volts to Vcc, there are other voltages or other electrical quantities that are decreasing values. The same principle can be applied nevertheless for the terminals where these potentials are encountered.

Furthermore, two phenomena have been discovered in the invention. The first phenomenon is a late measurement phenomenon. The second phenomenon is a fluctuation phenomenon. With regard to the late measurement phenomenon, it has been realized that the specifications dictated by the manufacturer sometimes lead to the choice of excessively short nominal durations. With the invention, the idea has arisen of shifting the date of measurement no longer to a time prior to the end of the nominal duration but, on the contrary, to a time after it. It can then be seen unexpectedly that many components that had been discarded because of a test wrongly assessed according to the specifications are then considered to be sound since the potential measured, after the nominal waiting duration (with however a tolerable delay), reaches the expected stabilized value. In this case, the lengthening of the duration of the test, unlike what happens in the prior art, increases the output (the number of sound parts per hour) since more components are ultimately accepted.

The fact of obtaining a variation, according to the invention, of the measurement date between the date of application of the electrical testing signals and the end of the nominal duration has naturally led to the recording of the chronology of the setting up of the potentials at the tested terminals. This chronology is a vital piece of information for the manufacturer who, before the invention, could have available only the results of simulations. Furthermore, the measurement of this chronology reveals the existence of fluctuating potentials that are never properly stabilized. For these potentials, it is not truly possible to find a criterion of reduction of the nominal waiting duration. It is therefore not reduced. However, it is known that the potential is fluctuating whereas this was not known previously.

Replacing the pair formed by the nominal duration and the standard value by the pair formed by the intermediate date and the progressive intermediate value means having to measure a premature value that is compatible with the progressive value. In order to have measurement results in a way that is coherent with old tests (namely, those performed prior to the invention), it is furthermore chosen to edit a measurement value that is not the actually measured premature value but a stabilized fictitious value which would have been obtained if the end of the nominal duration had been awaited. In this case, a function generator makes it possible to determine a function to be applied to the value of each electrical quantity measured with the new periods, so that each of them is reduced to the value that it would have had with the initially planned periods.

The reduction of the wait which is done automatically, preferably dichotomously or step by step, makes it possible to gain time and therefore reduce the costs of manufacturing the electronic components. A dichotomous reduction is the reduction in which preferably the duration of the steps gradually becomes smaller. The reduction is expressed as a percentage of the nominal duration. Steps of 5% are planned in the step-by-step reduction. Smaller steps may be envisaged in the dichotomous reduction.

The existing testing machines comprise means to bring about the measurement at the end of a single nominal waiting duration. Since these machines are controlled by programs and since these programs can be parameterized, "WAIT 100" type instructions will be found for example in these programs. This means that the measurement must be made 100 milliseconds after the application of the electrical testing signal. In order to implement the invention in a simple way, these instructions are replaced in these programs by calls to subprograms which would have the following effect: 1) at the time of the characterizing of the test, the measurements will be repeated with gradually reduced waiting times, and 2) at the time of the tests, the initial value (100) will be replaced by a value corresponding to the determined intermediate date.

However, it is planned that the future testing machines may be connected to measurement devices, in one stroke, for the measurement of the full chronology of the signal present at a terminal. It is enough simply to connect their signal input to a fast sample-and-hold device and to a digital-analog converter that is itself connected to a digital signal processor which, in a single operation, memorizes all the measurements made. The step-by-step or progressive reduction is therefore not essential in the invention although it is a preferred form of it.

According to another characteristic of the invention, the testing machine may include means that are capable of altering the comparison phase of the sequencer so that the operation is permanently conducted with the function determined by the function generator. The tool is then put out of operation inasmuch as it no longer modifies the waiting phases and therefore lets the sequencer manage the steps.

In a simplified embodiment of the tool, the processing means work by progressive reduction of the second period or periods of measurement, and only of this second period or periods, until the end criterion or assessment criterion has been met.

In another embodiment of the tool, the processing means work repetitively by the reduction of the second period or periods of measurement and then by the gradual reduction of the first period of stabilization until the end criterion has been met.

According to yet another characteristic of the invention, the processing means comprise filtering means capable of eliminating aberrant electrical quantities relating to their respective fields of validity, thus enabling the results to be improved.

Preferably, the processing means comprise adaptation means capable of fixing a first definitive stabilization period between the new first determined stabilization period and the initial first stabilization period as a function of the comparison between said predetermined threshold and the mean taken on the results of the comparisons made on the series of electronic components.

Thus, in order to preserve the production output level (the ratio between the number of components deemed to be sound and the number of components tested) above a modifiable threshold or to modify it according to different tolerance brackets that depend on the batches of components, it is possible to decide to choose waiting periods that are greater or smaller than those determined during successive reduction operations.

In the following description, given by way of an example, reference shall be made to the appended drawings, of which.

BRIEF DESCRIPTION OF THE DRAWINGS

The appended drawings contain numerous element of certain nature. Consequently, they are incorporated to the specification and will contribute to the definition of the invention.

DESCRIPTION OF THE PREFERRED EMBODIMENTS

Figure 1:
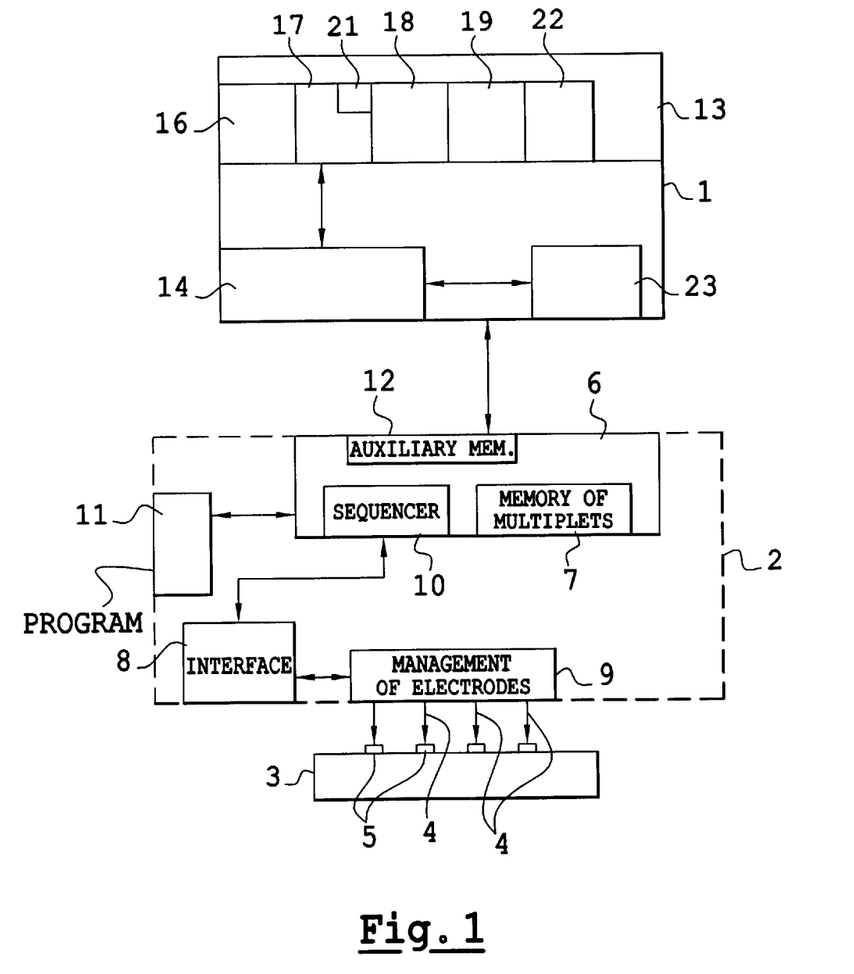
FIG. 1 is a functional block diagram of an assistance tool according to the invention and the associated testing machine.

Reference shall be made first of all to FIG. 1 to describe a preferred embodiment of the assistance tool 1 according to the invention designed to work in cooperation with a testing machine 2 (shown in dashes).

This testing machine 2 is designed to test the working of electronic components 3. To do this, the testing machine 2 comprises several electrodes 4 designed respectively to set up mechanical contacts on the conductive zones 5 of the electronic component to be tested. These conductive zones are, in the case of an electronic chip for example, the connection pins forming supply pins and input or output pins for electrical signals.

A testing machine of this kind therefore has the function of testing all the functions offered by an electronic component. Each conductive zone must therefore be tested either separately or in combination with one or more other conductive zones.

In order to enable the testing of the conductive zones 5 of the component 3, the testing machine 2 has testing means 6 comprising a memory 7 in which there are stored a plurality of multiplets with configuration parameters respectively forming elementary tests. A complete test of a component generally comprises a succession of different elementary tests.

Each multiplet comprises at least one designation of an electrode to there must be applied an electrical signal SE, the value of said electrical signal SE to be applied, the designation of at least one electrode at which an electrical quantity, forming a response of the electrical component 3 to the electrical signal SE, must be picked up, the type of electrical quantity to be picked up on the designated electrode or electrodes, at least one first fixed stabilization period D1 to allow the stabilizing of the electrical quantity to be picked up after application of the electrical signal SE, possibly a second fixed measurement period D2 to enable the stabilization of the measurement of the picked-up electrical quantity GEC and at least one field of validity for the measured electrical quantity GEM. The set of multiplets may be stored in the form of a data file organized for example in a form of a database.

These testing means 6 are connected to an interface 8 that is itself connected to means 9 for the management of the electrodes 4. The interface 8 is driven by a sequencer 10 housed, for example, in the testing means 6. This sequencer 10 is designed to configure the interface 8 with the parameters contained in one of the multiplets of the memory 7. Once configured, the interface 8 is ready to perform a chosen test, corresponding to the configuration multiplet, on the electrodes designated by said multiplet.

The testing machine 2 is managed by a computer program PRG stored in a main memory 11, furthermore containing libraries proper to the computer language used for the writing of the program PRG, for example the language C. Naturally, this program may be written in any other computer language.

Figure 2:
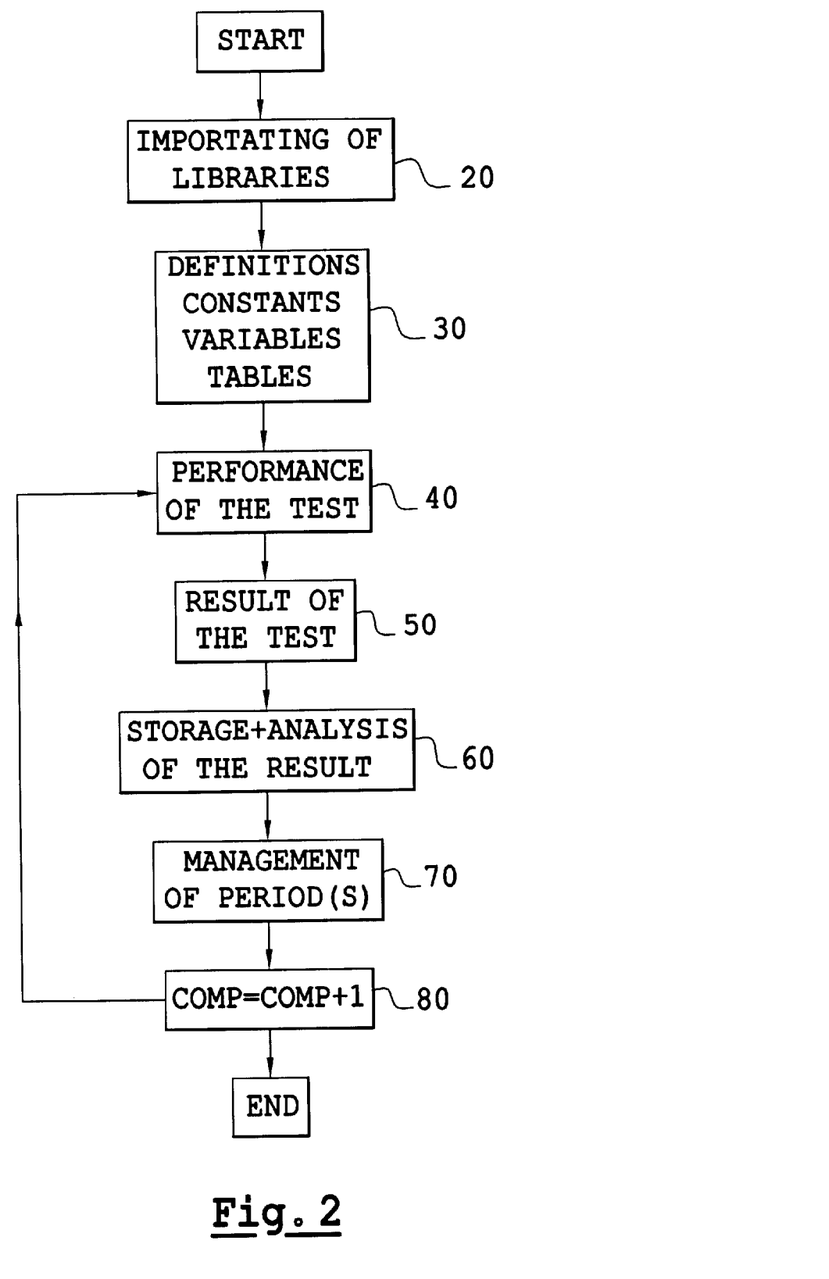
FIG. 2 is an algorithm illustrating a general mode of operation of the tool and of the testing machine of FIG. 1.

Reference shall now be made more particularly to FIG. 2 to describe the general mode of operation of the testing machine 2 of FIG. 1.

The running of a test performed by a standard testing machine comprises a sequence of steps managed by the sequencer 10. At the beginning of the test, the user calls the program PRG. This activates the importing 20 of libraries that are stored in the main memory 11 and are needed for the efficient operation of the program PRG. Then, from the list chosen by the program PRG, the user chooses the electronic component to be tested and, possibly, the type of test if this choice is offered by the program PRG. This selection may also inform the testing machine of the number of electronic components of the same type that the user wishes to test successively. This is the step 30 during which the program, depending on the electronic program chosen, defines a certain number of parameters such as for example constants, variables designating key words and data tables. In fact, in this step 30 (or a)), the program PRG is configured with the parameters contained in the multiplet which corresponds to the test chosen, which is stored in the memory 7 of the testing means 6.

The performance as such of the test (step 40 of FIG. 2, of steps b) to d)) may then begin. We shall return further below to the details of an execution of this kind.

If for example the elementary test chosen comprises only the measurement of an electrical quantity GE, then at the end of its performance, a measured electrical quantity GEM is obtained. This is the step 50 (or step e)). The result GEM is memorized, for example, in an auxiliary memory 12 of the testing means 6 and then this result is analyzed. This constitutes the step 60 (of step f)). This analysis consists in comparing the result GEM with the field of validity that corresponds to it in the multiplet of configuration of the test performed. In a standard testing machine, if the result GEM belongs to the field of validity, then the electronic component 3 is considered to be SOUND. If not, it is considered to be DEFECTIVE. The operation then goes to the next step 70. This next step 70 consists either in testing the next electronic component 3 or else in terminating the test if there is only one electronic component to be tested or if the terminated test is that of the last component of a series, or else again in carrying out another test on the same component.

In general, the analysis of an electronic component comprises a succession of different tests forming a test sequence designed to test all these conductive zones 5. Now, the performance of each test comprises a multiplicity of operations which, in some cases, calls for compliance with waiting phases (or periods) designed to enable the stabilizing of an applied electrical signal SE, an electrical quantity GE to be picked up or again the stabilization of the measurement of the electrical quantity picked up.

These waiting phases form part of the step 40 of FIG. 2. They consist especially of the steps b) and d).

In the step b), the electrical signal (or the electrical signals) SE chosen for the test is or are applied and then there is a wait during a first fixed period (or waiting phase) of stabilization D1 corresponding to said test. Naturally, when the test consists of the application, substantially at the same time, of several possibly different signals to the different electrodes, it is possible to provide for several first stabilization periods D1 of different durations or else a single first stabilization period corresponding to the first longest period. This step b) enables the electrical signal SE to be set up in the concerned circuit of the electronic circuit 3.

In the optional step d) that comes after the step c), during which the electrical quantity or quantities GE designated by the chosen tests are captured (this step may consist for example in closing the concerned circuit in the electronic component or in other words in connecting the output terminals in order to measure the electrical quantity GE designated by the test), it is possible to provide for a new waiting phase called a second measurement period D2 corresponding to the chosen test so that the measurement means have sufficient time available to measure the electrical quantity thus designated. Naturally, as in the case of the first stabilization period D1, when several electrical quantities have to be measured substantially at the same time, it is possible to provide either for a plurality of second measurement periods D2 respectively for each electrical quantity to be measured or for the longest of the second measurement periods D2.

Each of the measurement phases may last several milliseconds or even several tens of milliseconds. These waiting phases have durations that are greatly overestimated so as to ensure the quality of the result of the test.

Now, the Applicant has realized that, contrary to a widespread view, it is possible, through a "learning" process, to reduce at least some of the durations (or periods) of the waiting phases for each test.

To do so, the invention provides for an assistance tool 1 designed to be connected to the testing machine 2 in order to take control over at least some of these operating steps. In the algorithm of FIG. 2, this takeover of control is done during the step 70, between the steps 60 and 80, namely after the sequencer 10 has made a complete loop (steps a) to f)).

The assistance tool 1 comprises, in particular (see FIG. 1), processing means 13 designed to take control over the testing means 6 of the testing machine 2 in order to repetitively carry out the steps b) to e) of the sequencer 10 with, at each time, a first stabilization period D1 and/or a second measurement period D2 with a value smaller than the previous value, until a predetermined end criterion has been met. This end criterion takes account of the distribution of the electrical quantities GEM measured and memorized during the step 60 (see FIG. 2) for each reduced value of a (first and/or second) period.

Furthermore, the processing means 13 are capable, after the end criterion has been met, of setting up new values of first stabilization periods ND1 and/or second measurement periods ND2, at most equal to their initial values D1 and D2, and for which the distribution of the electrically measured and memorized variables GEM verifies a chosen condition of variance according to the invention. Thus, the assistance tool may, automatically and without any external assistance, fix one or more new periods with durations smaller than or equal to their respective initial values. This makes it possible, in certain cases, to very substantially reduce the duration of the test, more particularly, when these tests are performed on very large batches of electronic components. We shall return further below to the mode by which the assistance tool 1 takes control over the test means 6.

Given that the progressive reduction of the waiting phases leads to variations in the values of the measured electrical quantities GEM, it is indispensable, in order to enable the verification of the membership of the measured electrical quantity GEM in the field of validity that corresponds to it, to have available a function enabling GEM to be reduced to the value that it would have had if the waiting phases had durations identical to the initially planned durations.

Figure 3A:
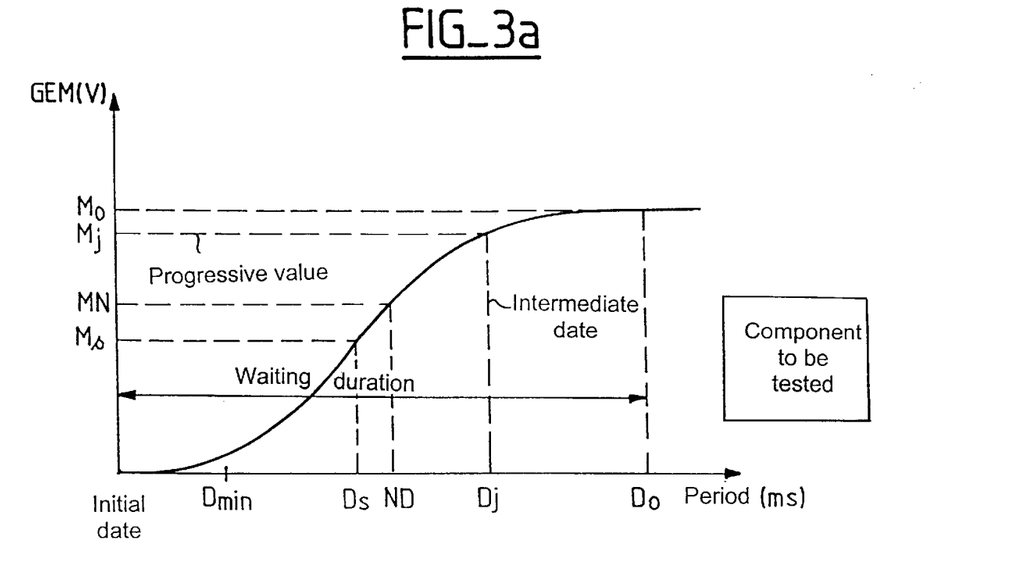
FIGS. 3a and 3b are diagrams illustrating the development of a measured electrical quantity (GEM) as a function of the waiting period to perform the measurement.
Figure 3B:
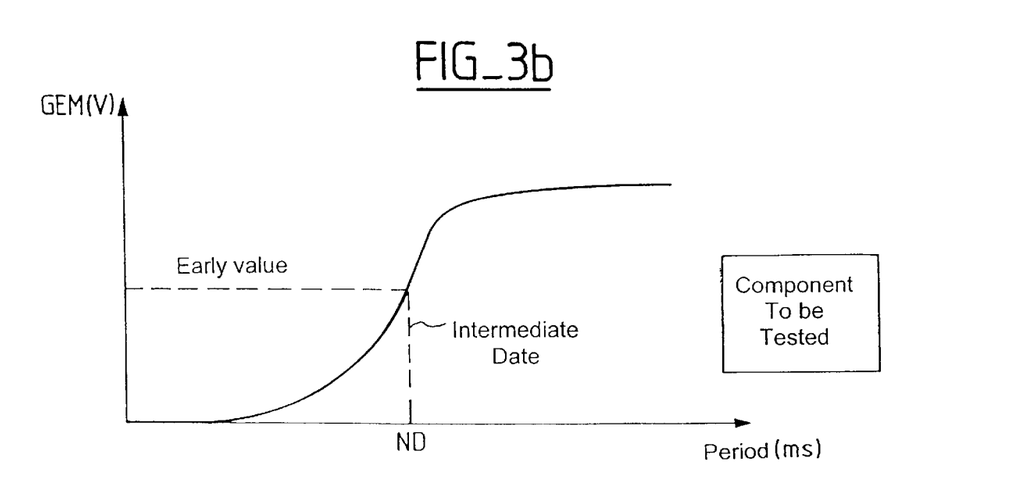

FIG. 3a shows the progress of the value of a measured electrical quantity GEM as a function of the waiting period for the performance of its measurement. FIG. 3a shows the progress for a component to be accepted which is known to be SOUND. FIG. 3b shows the progress for a component to be tested. It is assumed that the waiting duration concerned is a measurement period D. To an initially planned nominal measurement period D0, there corresponds the value Mo for the measured electrical quantity GEM. This electrical quantity may for example be a voltage. When the duration (or period) of measurement is reduced, the value of the measured electrical quantity GEM decreases to the value 0 for a duration of period Dmin greater than or equal to 0.

Figure 3C:
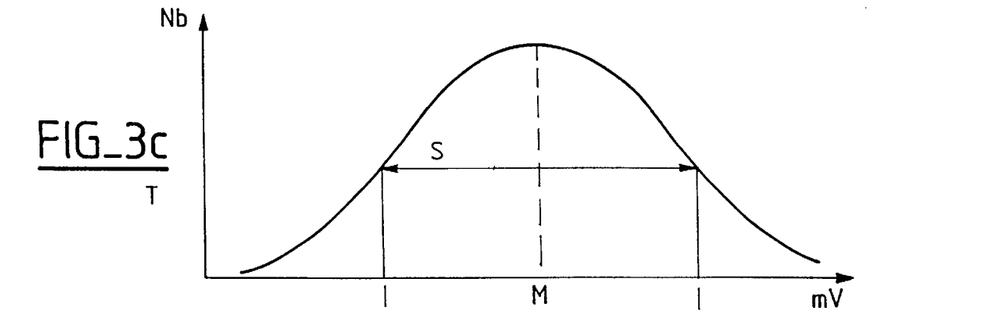
FIGS. 3c to 3e illustrate the method of the invention.
Figure 3D:
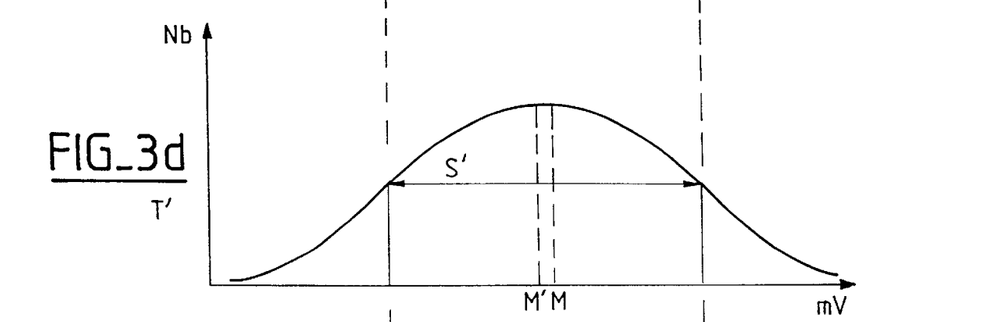
Figure 3E:
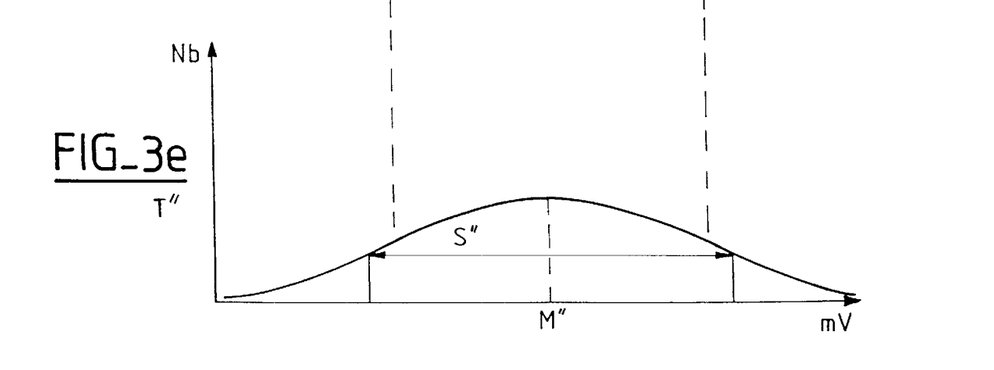

FIGS. 3c to 3e shows a statistical distribution of the results for a given test at dates T, T', T" that are increasingly early. The y-axis shows the number of samples for which the value of the measurement result has corresponded to an x-axis value. The x-axis also shows values of mV for, in this example, the measurements are differential voltage measurements: for example, the measurement at a test point of the difference in voltage value with the supply voltage of the circuit. It can be seen in a simplified form that the statistics of FIG. 3e are highly spread out: the standard deviation S" is great.

It is therefore possible, on the basis of a nominal duration T, to carry out statistical measurements (of M, S or other values) of the invention at T'=0.95T, T"=0.9T and so on and so forth.

As a variant, with a sample-and-hold device present in the measurement circuit and fast analog-digital converters, it is possible, at one stroke and for each sample, to acquire a discrete chronology of the progress of the signal tested during a test. It is possible to acquire this chronology for a population of samples.

In any case in the invention, the statistics are then drawn up of the measurements made at each date (T, T', T"). These statistics are preferably a measurement of the standard deviation. Other statistical elements may be planned. It is then possible to plot a curve of the progress of the statistical element measured (S, M or the like) as a function of T, T', T". On the curve thus obtained, the value of the date chosen is the one for which the statistical element is in a given proportion to the basic element. In short, T" is chosen when S" is smaller than S*(1+x %), x being given or dictated by the manufacturer's customary practices. In one example, x equals 2.

In the same way, preferably two other criteria referenced CPKl (low) and CPKh (high) are defined. The expression of these criteria is:

$$CPKl = \text{mean of the values} - \text{low limit}/S$$

$$CPKh = \text{mean of the values} - \text{low limit}/S$$

The terms between are terms taken in terms of absolute values.

The mean of the values M is the mean of the values found at a given date T. At an earlier date T', the coefficients CPK become:

$$CPKl' = M' - \text{low limit}/S'$$

$$CPKh' = M' - \text{low limit}/S'$$

Thus if, at the date T, the mean value is 5 volts and if the limits are 4.5 volts and 5.5 volts for the upper and lower limits, $$CPKl = 0.5/1 = 0.5$$

$$CPKh = 0.5/1 = 0.5$$

On the contrary, at an earlier date T', even if S' is still equal to S (FIG. 3d), it is possible to want a stricter criterion. It is indeed possible that the value M' is equal to 4.6 volts. In this case, the coefficients CPKl and CPKh are respectively equal to 0.1 and 0.9. In the invention, with this type of criterion, firstly it is decided to choose the lower of the two coefficients, namely the least favorable one. Secondly, it is decided to fix a limit date T" that is the date on which the coefficient CKP' is in a given ratio or has a given difference with respect to the basic coefficient CPK. For example, T" is chosen to be the earliest limit date when one of the values of CPK has reached a limit excursion with respect to the nominal CPK.

These methods of operation then have the advantage wherein the appreciation of the date T" (the earliest possible date) on which the measurements must be made (to gain the greatest amount of time possible during the test) is the one for which the population examined will keep the same homogeneity. This method of operation then makes it possible to choose the date T" to be chosen as a function of an interval of confidence known in advance. The consequence of this is an adjustment of the speed of the test to a criterion of efficiency instead of a purely technical criterion. A batch of integrated circuits tested according to the invention may then be marketed with the certainty that they fulfill the same conditions of reliability (for example with one defective part judged to be sound every 100,000 parts) as a batch tested according to the old, lengthier method. The invention therefore makes it possible to quantify this requirement of output. In practice, compliance with this requirement of output has an immediate technical effect on the uses of the testing machine: these uses are optimized.

A threshold value Ms (FIG. 1a) is defined. Below this threshold value Ms, the value of the measured electrical quantity GEM is no longer significant at all. To this value Ms, there corresponds a second measurement period Ds. Thus, all the measurements Mj included between the values Ms and Mo could be exploited by the assistance tool 1. The crossing of this threshold value Ms by the lower value is the end criterion. In one example, Ms equals 1 volt. In another example, Ms equals 50% or another percentage of Mo.

The function generator 14 is aimed at preparing a function that can be applied to the field of validity and is capable of reducing the value Mj of a measured electrical quantity GEM (for a measurement period Dj) to the value Mo that this measured electrical quantity should ought to have had if it had been measured on a period with a duration equal to D0.

Figure 4:
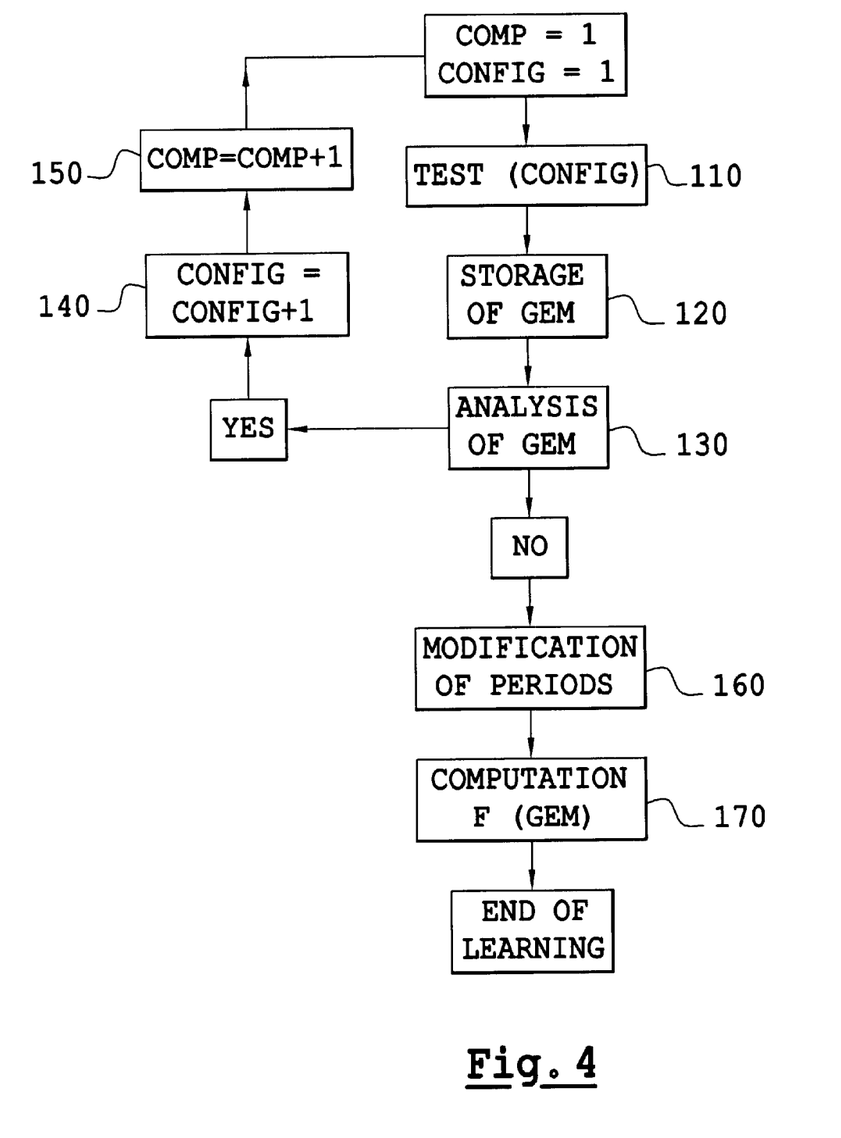
FIG. 4 is an algorithm illustrating a learning mode of the tool and of the testing machine of FIG. 1.
Figure 5:
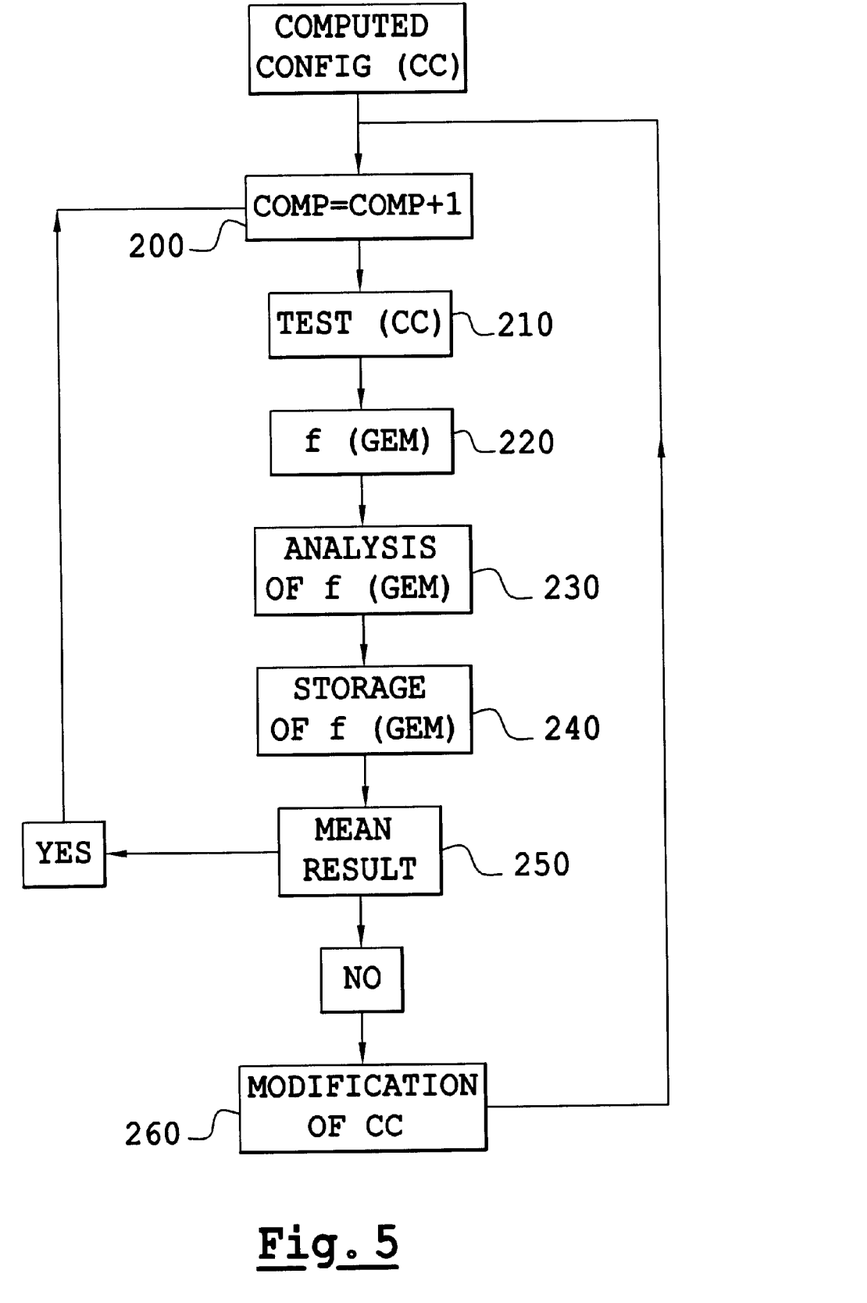
FIG. 5 is an algorithm illustrating a mode of operation of the testing machine and of the tool after learning.

Reference shall now be made more particularly to FIGS. 4 and 5 to provide a detailed description of a mode of operation of the assistance tool 1.

The tool works according to two different modes: a first mode known as the learning mode (FIG. 3a) during which it searches for one or more minimum values of waiting phase duration to reduce the duration of the tests chosen by the user of the testing machine, and a second mode (FIG. 3b) that comes after the learning mode during which it hands over the operation to the sequencer 10 so that it performs the steps a) to f) with a new configuration of periods of time determined during the learning.

The aim of the learning phase (see FIG. 4) is to obtain a response curve (see FIG. 3) of each electrical quantity to be measured as a function of the durations of the waiting phases.

To do so, the processing means 13 comprise an interception module 16 designed to take control of the sequencer 10 by the interception of at least the phases b) to f). This is actually an interruption in the normal running of the test chosen by the user.

Preferably, in order to gain time, the learning stage is carried out on one and the same electronic component to be accepted. But naturally each learning phase, and especially each period reduction step, may be performed on successive electronic components. Preferably, when the learning is done on one and the same component, the learning tool 1 allows the testing machine 2 to carry out the steps a) to f) for the first time with the initial delays corresponding to the chosen test. Hereinafter in the description, it will be assumed that the steps a) to f) (or the steps 20 to 60 of FIG. 2) form a loop of the program PRG of the testing machine 2.

The sequencer 10 of the testing machine 2 then begins the second loop by performing the steps a) (configuration of the interface 8). It is then that the assistance tool 1 comes into action. This tool inhibits at least one of the following two periods, the first stabilization period D1 and the second measurement period D2. This operation can be done by searching for key words that designate the periods in the program PRG, entrusted with the parameters of the multiplet corresponding to the chosen test. In practice, a search is made for the instructions "WAIT" that are in this program. Thus, after or before each of the key words corresponding to the period to be modified, the interception module 16 places an interruption command (in the computer language of the program of the testing machine 2) and replaces it with a reduced period of duration, for example Dj (see FIG. 3a) greater than Ds. The reduction may, for example, be of the step-by-step type or of the dichotomous type. Naturally, these two modes of reduction are in no way exhaustive. Each substitution of a period may, if necessary, be followed by a recompilation of the program PRG.

The second program loop PRG may then continue with the steps b) to e). This constitutes the step 110 of FIG. 4. Then, between the step e) and the step f), a step 120 is performed during which the value of the electrical quantity measured during the previous steps of the loop in progress is memorized in a working memory 17 of the processing means 13 of the assistance tool 1. Naturally, the values of GEM can be stored in the auxiliary memory 12 of the testing machine 2. Then, the previously memorized variable GEM is compared with the predefined threshold value Ms with which there is associated the period Ds for example which is stored in a comparison module 18 of the processing means 13. This is the step 130.

Two cases then arise. Either the value of the measured electrical quantity GEM is smaller than the threshold value Ms and there is then a direct passage to a step 160 described further below, or the value of GEM is greater than Ms and, in this case, it is possible to carry out a further reduction of the duration of the period. This operation is performed during the step 140 during which the interception module 16 searches for the interruption commands that it has placed previously in the program PRG in order to carry out a new substitution of the period to be modified by means of a new step. This gives a new configuration. At this stage, when the learning phase is done on successive electronic components, there is provided a step 150 where the component that has just been tested is replaced by the following component.

The steps 110 to 140 (and possibly 150) are then recommenced with the new period value reduced from its previous value, until the value of the measured electrical quantity GEM is below the threshold value Ms.

When this is the case, the operation goes to the step 160 during which the processing means 13 chose a definitive period between the initial period, in this case D0, and the period Ds corresponding to the threshold value Ms. This new period is called ND and it is associated with the corresponding value MN of GEM on the curve prepared point by point by the processing means 13 from the experimental measurements made during the different loops of the learning phase.

This new period ND is then stored in the working memory 17 of the processing means 13 which will insert it at the specified places during the initial phase of searching for key words, instead of the arguments that follow the WAIT instructions. Then, in a step 170, the functions generator 14 of the assistance tool 1 prepares the function f (GEM) to be applied to the electrical values GEM measured on the electronic components to be subsequently tested so that their values measured for the period ND are reduced to the value that the electrical quantity measured should have taken if it had been done with a period D0 as initially chosen for the test. This procedure is in no way indispensable. It is useful for the comparison, with one another, of the tests made prior to the invention and with the invention.

It is possible, as an alternative, to provide for the processing means 13 that are capable, for example by means of the interception module 16, of applying a function which is the reverse to that chosen f( ), in order to modify the field of validity corresponding to the electrical quantity to be measured so that, during the following test, the value of the measured electrical quantity is compared with the new domain of validity corrected by the reverse function instead of applying the function f() prepared during the step 170 to this value of the measured electrical quantity so as to compare it with the initial domain of validity.

All these experimental pairs containing the measurements GEM computed during the successive loops of the learning phase, and the corresponding period or periods, said pairs forming the response curves of the component, are henceforth stored in the form of a table of correspondence in the working memory 17 of the processing means. However, they could also be stored in a memory planned for this purpose in the function generator 14 or in a memory of the testing machine 2. The elements of this invention, the method and assistance tool for electronic component testing machines may thus be stored in the testing program, in libraries called up by the testing program, in the memory of the tester, or in any other medium enabling storage as well as in the operating system of the tester.

Naturally, this correspondence table may be formed by triplets or more generally by multiplets, if the value Mj of the measured electrical quantity GEM concerned depends not only on a first period D1j of stabilization but also on a second period D2j.

The learning phase is then ended. The assistance tool 1 may then permit the testing instrument 2 to continue the tests with a new period ND determined during the learning phase. The assistance tool 1 then goes into its second mode of operation (see FIG. 5). In this mode, the learning tool 1 henceforth comprises the "theoretical" response curves of each of the measured electrical quantities GEM of the electronic components of the batch to be tested.

Two sub-modes may be envisaged. In a first submode, the tool 1 comprises a module 23 capable of altering the part of the program PRG corresponding to the phase f) of the sequencer 10 so that this phase permanently works with the function f( ), namely by methodically applying f( ) to each value GEM before making the comparison thereof, or else by applying the reverse function of f( ) to the field of validity to be compared with the corresponding GEM. The tool may then go "off service" and allow the sequencer 10 to work without external intervention.

In a second submode, the tool 1 permits the sequencer 10 to start a new loop with a new configuration CC that has just been computed. This configuration contains the new periods. Then the component that has been tested beforehand is replaced by the following component. This constitutes the step 200. Then, in a step 210, the test is performed with the computed configuration CC. This corresponds to the step b) to e) of the sequencer 10. Once the value of the measured electrical quantity GEM is obtained, the function (f) is applied to it during the step 220. This gives a value f(GEM). This value f(GEM) is then analyzed in a step 230. This analysis actually corresponds to the step f) of the sequencer 10 since it is a comparison between f(GEM) and the field of validity that corresponds to the electrical quantity of the test in progress.

The processing means 13 of the assistance tool 1 may be provided with a filtering module 19 designed to eliminate measured electrical quantities when they are at too great a distance from the field of validity in which they must be performed after the analysis step 230. Under this assumption, if the value is considered to be aberrant, the test is begun again by returning directly to the step 210. If not, the operation goes to the step 240 entailing the storage, for example in a zone 21 of the working memory 17 of the processing means 13, of f(GEM) which has been calculated beforehand from the value GEM measured with the new period ND2.

During the step 230, the analysis of f(GEM) gives a result indicating whether the component being tested is SOUND or DEFECTIVE. In a step 250, the processing means 13 of the assistance tool 1 take a mean on all the results obtained on the electronic components tested up till then, using results stored in the zone 21 of the working memory 17.

This mean is then compared, for example by the comparison module 18 of the processing means 13, with a predetermined output threshold. Thus, it is possible to determine whether the series of electronic components being tested is below or above the output threshold fixed by the user. If necessary, the criterion CP' is adjusted accordingly.

The processing means 13 of the assistance tool 1 comprises an adaptation module 22 arranged, firstly, to make a comparison between the mean taken during the step 250 by the processing means 13 and the predetermined output threshold and, secondly, as a function of this comparison to decide whether the new modified period ND should be adapted to the output threshold chosen by the user. If this is the case, the adaptation module 22 sets up a new modified period NDM that is greater than the previous period ND determined during the learning phase. This modified period NDM is then put into the program PRG, during the step 260, in place of the previous period ND. The operation then returns to the step 200 in order to test the next electronic component. Then the steps 200 to 260 are reproduced until there is no longer any electronic component to be tested.

Naturally, the modification step 260 may relate to several periods, for example the first period D1 and the first period D2 or else only to the first period D1. It is possible to envisage a variant of this second sub-mode wherein the experimental pair measured, comprising the value Mj and the duration Dj, is compared with the corresponding pair memorized in the table of correspondence 17 having the same period D as that of the experimental pair. If the experimental value of Mj is substantially identical to the theoretical value of the electrical quantity stored in the table of correspondence 17, then the function of the electronic component tested is considered to be valid; and consequently if only one electrical quantity has to be tested on this electronic component, it is considered to be SOUND.

It is clear that the modification of the period after the learning phase may be adapted to the first sub-mode described here above. To do this, it is sufficient, after each phase f) performed by the sequencer 10, for the tool 1 to "resume control" in order to compute a mean on the results of the components, which is a mean of the type described with reference to the second sub-mode.

Furthermore, the assistance tool 1 may be organized so that, during the learning phase, it carries out a progressive, alternating reduction of the second measurement period which may be longer than the first stabilization period, then a progressive, alternating reduction of this first stabilization period. In this mode of operation, the procedure is as follows: first of all, in a first loop, the second period D2, for example, is reduced and then, through one or more loops, the first period D1 is modified, the period D2 being kept modified until the end criterion is met (crossing of the threshold value Ms), then a loop is made again by reducing the second previously modified period D2, again followed by a plurality of loops for the reduction of the first period D1. Many other modes of operation combined with reductions of the periods D1 and D2 may be envisaged.

The invention cannot be limited to the embodiment described here above but encompasses all the variants that could be developed by those skilled in the art in the context of the claims here below.

Thus, the arrangement of the different modules described here above could be substantially different from the one described. In particular, the processing means and the function generator could be made in the form of a single multifunctional electronic module (or component). Similarly, the different memories could be made in the form of a single memory subdivided into zones or registers.

This assistance tool could even be made entirely with software modules capable of being directly implanted in the testing machine. In this case, it is clear that the memory modules used by this tool would be those of the testing machine.

What is claimed is:

1. A method for testing a batch of electronic components, wherein each component has a conductive region formed thereon and a predetermined range of acceptable performance values associated therewith, the method comprising the steps of:

applying a first electrical signal to an electrode that is electrically coupled to a conductive region of each component wherein the first signal is applied by a testing system;

measuring a second electrical signal response to the first electrical signal applied to the electrode, wherein the second signal is measured by a testing system after a nominal waiting period resulting from a nominal wait signal;

generating a modified wait signal corresponding to the batch of components, wherein the testing system replaces the nominall waiting period with a modified waiting period corresponding to the modified wait signal, applying the first electrical signal to the component and iteratively measuring the second electrical signal after different waiting periods, said measuring being generated by a modified wait signal, processing second electrical signals corresponding to the different waiting periods in order to determine an adjusted waiting period so that a statistical value representing second electrical measurements at the adjusted waiting period is acceptable with regard to a criterion; and testing each of the components, wherein the testing system compares for each of the components, and at said waiting period, the second electrical signal to the predetermined range of acceptable performance values.

2. The method according to claim 1, wherein the modified wait signal is generated based on interatively aoolying the first electrical signal to an acceptable electrical component.

3. The method according to claim 2, wherein the first electrical signal is iteratively applied to the same component.

4. The method according to claim 3, wherein the first electrical signal is iteratively applied to different components.

5. The method according to claim 1, wherein the processing step includes generating a set of statistical data corresponding to the second electrical signals and the different waiting periods and applying a mathematical function to the set of data.

6. The method according to claim 5, wherein the mathematical function includes calculating a mean and a standard deviation corresponding to the set of data.

7. The method according to claim 6, wherein the modified wait signal is generated based on analyzing a ratio between a first value of the absolute value of the difference between the mean and a tolerated limit for the mean and a second value corresponding to the standard deviation of the set of data.

8. The method according to claim 1, wherein after the nominal waiting period is modified, the second electrical signals corresponding to the remaining components are measured after the modified waiting period.

9. The method according to claim 8, wherein the second electrical signals corresponding to the modified waiting period are similar to the second electrical signal corresponding to the nominal waiting period.

10. The method according to claim 1, wherein the predetermined range of acceptable performance values is modified based on measuring progressive values of potentials that are set up at a set of terminals of an acceptable batch of components.

11. The method according to claim 1, wherein the predetermined range of acceptable performance values is modified based on applying a statistical function to a set of data corresponding to the second electrical signals of different components.

12. The method according to claim 11, wherein the statistical function includes filtering out a set of aberrant values.

13. The method according to claim 12, wherein the statistical function includes computing a mean of the values.

14. The method according to claim 12, wherein the components are acceptable if the second electrical signals are within the modified range of acceptable performance values.

15. The method according to claim 1, wherein the iterative process of generating the modified wait signal is monotonically decreasing.

16. The method according to claim 1, wherein a set of potentials to be measured undergo a transitional phase followed by a stable phase, and an intermediate phase of the potentials is chosen.

17. A testing system configured to test a batch of electronic components, wherein each component has conductive regions formed thereon and a predetermined range of acceptable performance values associated therewith, the testing system comprising:

a set of electrodes electrically coupled to conductive regions of each component;

testing means including a processor, a memory and a sequencer;

wherein the testing means is coupled to an interface connected to an electrode management system;

wherein the testing means configures the interface with a sequencer; and wherein the testing means is configured to apply a first electrical signal to the electrodes, measure a second electrical signal in response to the first electrical signal applied to the electrodes, wherein the second electrical signal is measure after a nominal waiting period resulting from a nominal wait signal, generate a modified wait signal corresponding to the batch of components, wherein the nominal waiting period is replaced with a modified waiting period corresponding to the modified wait signal, applying the first electrical signal to the component and iteratively measuring the second electrical signal after different waiting periods, said measuring being generated by said modified wait signal, processing the second electrical signals corresponding to the different waiting periods in order to determine an adjusted waiting period so that a statistical value representing second electrical measurements at the adjusted waiting period is acceptable with regard to a criterion, and test each of the components, wherein the testing system compares the second electrical signal to the predetermined range of acceptable performance values.

* * * * *